(12) United States Patent
Kawamura et al.

(10) Patent No.: US 10,340,008 B2
(45) Date of Patent: Jul. 2, 2019

(54) ELECTRONIC DEVICE AND DISCHARGE METHOD

(71) Applicant: TOSHIBA MEMORY CORPORATION, Tokyo (JP)

(72) Inventors: Takuma Kawamura, Sumida Tokyo (JP); Naoki Kimura, Ebina Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,501

(22) Filed: Mar. 2, 2018

(65) Prior Publication Data

US 2019/0088332 A1   Mar. 21, 2019

(30) Foreign Application Priority Data

Sep. 19, 2017   (JP) .................. 2017-179050

(51) Int. Cl.
*G11C 7/00* (2006.01)
*G11C 16/04* (2006.01)
*G11C 16/30* (2006.01)
*G06F 1/3296* (2019.01)

(52) U.S. Cl.
CPC .......... *G11C 16/0483* (2013.01); *G11C 16/30* (2013.01); *G06F 1/3296* (2013.01)

(58) Field of Classification Search
CPC ........... G11C 5/147; G11C 5/14; G11C 5/143; G11C 11/4074; G11C 16/30
USPC .................................................. 365/226, 204
See application file for complete search history.

(56) References Cited

U.S. PATENT DOCUMENTS

| 6,137,733 A | * | 10/2000 | Watanabe | G11C 5/145 |
| | | | | 365/189.09 |
| 2012/0201062 A1 | * | 8/2012 | Lee | H02J 9/005 |
| | | | | 363/84 |
| 2016/0284309 A1 | | 9/2016 | Ishli et al. | |

* cited by examiner

*Primary Examiner* — Son T Dinh
(74) *Attorney, Agent, or Firm* — Kim & Stewart LLP

(57) ABSTRACT

In one embodiment, an electronic device includes a power supply circuit that has a first switch circuit between a power supply line and a ground potential. The first switch circuit connects the power supply line to the ground potential upon receipt of a control signal that is supplied when a supply of power on the power supply line is cut off. A capacitor is connected between the power supply line and the ground potential. A second switch circuit is between the capacitor and the power supply line. The second switch circuit is configured to disconnect the capacitor from the power supply line upon receipt of the first control signal. A controller circuit is configured to supply the first control signal when the supply of power on the power supply line is cut off.

20 Claims, 13 Drawing Sheets

US 10,340,008 B2

ELECTRONIC DEVICE AND DISCHARGE METHOD

CROSS-REFERENCE TO RELATED APPLICATION

This application is based upon and claims the benefit of priority from Japanese Patent Application No. 2017-179050, filed Sep. 19, 2017, the entire contents of which are incorporated herein by reference.

FIELD

Embodiments described herein relate generally to an electronic device and a discharging method of an electronic device.

BACKGROUND

Many electronic devices, for example, such as a solid state drive (SSD), are equipped with a low power mode for reducing power consumption during idle operation states or the like.

DETAILED DESCRIPTION

In general, for enabling a lower power mode in an electronic device it is required to discharge a residual voltage on a power supply circuit wiring in a short time after being shifted to a state in which operations of some device components are stopped, in order to enable operations of the components to be restarted quickly when required.

In general, according to one embodiment, an electronic device includes a power supply circuit that includes a first switch between a power supply line and a ground potential. The first switch is configured to connect the power supply line to the ground potential upon receipt of a first control signal. The first control signal is supplied when a supply of power on the power supply line is being cut off. A capacitor is connected between the power supply line and the ground potential. A second switch is between the capacitor and the power supply line. The second switch is configured to disconnect the capacitor from the power supply line upon receipt of the first control signal. A controller is configured to supply the first control signal when the supply of power on the power supply line is to be cut off.

Hereinafter, certain example embodiments will be described with reference to the drawings.

First Embodiment

Figure 1:
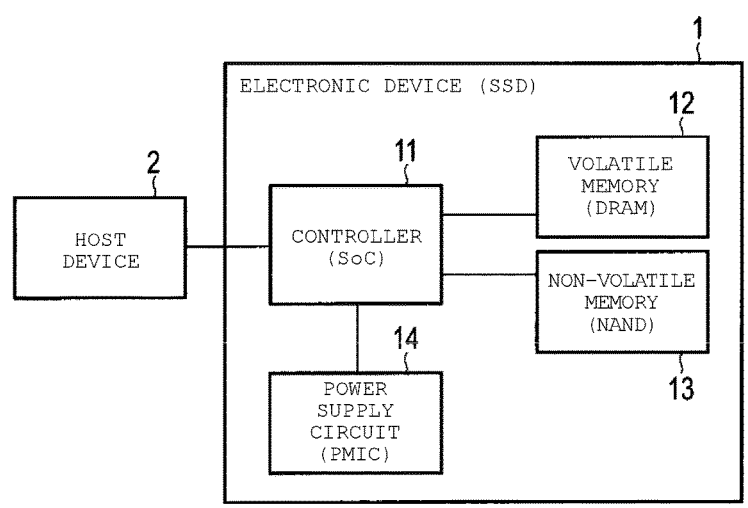
FIG. 1 is a diagram illustrating an example configuration of an electronic device according to a first embodiment.

FIG. 1 is a diagram illustrating an example of a configuration of an electronic device 1 according to the first embodiment. Here, it is assumed that the electronic device 1 is an SSD (solid-sate drive) used as, for example, a main storage of a host device 2. A discharge method of first embodiment can be applied to various electronic devices and is not limited to storage devices such as a SSD. The host device 2 is an information processing device, such as a personal computer (PC) or a server.

As illustrated in FIG. 1, an SSD 1 has a controller 11, a volatile memory 12, a non-volatile memory 13, and a power supply circuit 14.

The controller 11 is a processing circuit which receives a write command and a read command from the host device 2, uses the volatile memory 12 as a cache, writes data transferred from the host device 2 into the non-volatile memory 13, and reads data when requested by the host device 2, from the non-volatile memory 13. The controller 11 is, for example, a system on chip (SoC) incorporating a central processing unit (CPU). A program for causing the SSD 1 to execute various procedures is stored in a predetermined area of the non-volatile memory 13. A portion or the entirety of the program is loaded onto the volatile memory 12, for example, at the time when the SSD 1 is activated, and is executed by the CPU in the SoC 11.

The volatile memory 12 is, for example, a dynamic random access memory (DRAM). The non-volatile memory 13 is, for example, a NAND flash memory (hereinafter, referred to as NAND for simplicity).

The power supply circuit 14 is, for example, a power management integrated circuit (IC) (PMIC) that supplies power to each component within the SSD 1 under the control of the SoC 11.

Here, it is assumed that the SSD 1 has at least one low power mode. In a low power mode, the SSD 1 shifts from a normal power state PS0 to a power saving state such as power state PS1 to power state PS5 depending on elapsed time from a receipt of a write/read command in which no other command has been received. The power state of the SSD 1 is shifted between PS1 and power state PS5 (where, the power consumption amount in power state PS1 is greater than the power consumption amount in power state PS5) according the length of the period during which no write/read command has been received from the host device 2 remains discontinued. For example, in power state PS5 the operation of some components is fully stopped and supply of power to these components is cut off so as to reduce power consumption. Here, it is assumed that at the time of shift to power state PS5, supply of power from the PMIC 14 to the DRAM 12 and the NAND 13 is cut off under the control of the SoC 11. More specifically, at the time of shift to power state PS5, a stop instruction is issued from the SoC 11 to the DRAM 12 and the NAND 13, and a power stop instruction, for stopping supply of power to the DRAM 12 and the NAND 13 is issued from the SoC 11 to the PMIC 14. The DRAM 12 and the NAND 13 receiving the stop instruction end operations after executing any processing in preparation for stopping supply of power. The PMIC 14 receiving the power stop instruction cuts off supply of power to the DRAM 12 and the NAND 13. Issuance of the power stop instruction to the PMIC 14 is normally performed with a lag or delay period after issuing the stop instruction to the DRAM 12 and the NAND 13 so as to permit the completing of processing for stopping the DRAM 12 and the NAND 13.

When the write/read command is issued from the host device 2 when the power state is any one of power states PS1 to power state PS5, the SSD 1 returns to power state PS0 (normal power state). The SoC 11 issues a power restart instruction to the PMIC 14 and issues an operation restart instruction to the DRAM 12 and the NAND 13.

When the write/read command is issued from the host device 2 immediately after a shift to power state PS5 occurs, supply of power from the PMIC 14 to the DRAM 12 and the NAND 13 is restarted immediately after supply of power from the PMIC 14 to the DRAM 12 and the NAND 13 has been cut off. On the other hand, in order to restart supply of power from the PMIC 14 to the DRAM 12 and the NAND 13, a residual voltage on the power supply line between the PMIC 14 and the DRAM 12 when supply of power from the PMIC 14 to the DRAM 12 and the NAND 13 was cut off and the residual voltage on the power supply line between the PMIC 14 and NAND 13 should be less than or equal to certain threshold values respectively defined for these residual voltages. That is, the SSD 1 cannot return to power state PS0 until the residual voltages on these power supply lines drop to less than or equal to the threshold values. Accordingly, the PMIC 14 normally includes a discharge mechanism for actively discharging the residual voltages on the power supply lines.

Here, in order to facilitate understanding of the discharge method of the first embodiment, a general discharge method will be described with reference to FIGS. 2 and 3.

Figure 2:
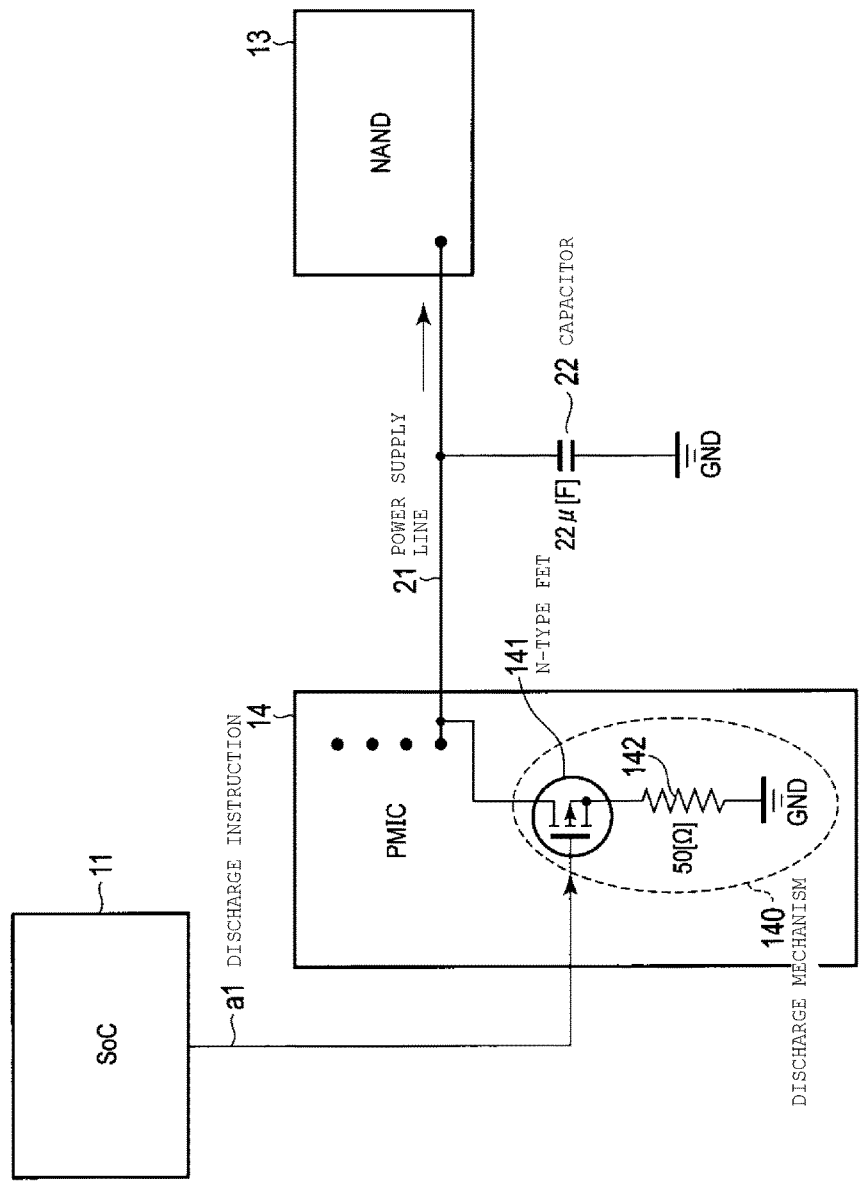
FIG. 2 is a first diagram for explaining aspects of a general discharge method.

FIG. 2 illustrates an example of a circuit configuration of for supplying power from the PMIC 14 to the NAND 13. Here, the same reference numerals are used for elements which are common in the constitutional elements relating to the discharge method of the first embodiment and the constitutional elements relating to the general discharge method.

As illustrated in FIG. 2, the PMIC 14 includes a discharge mechanism 140. The SoC 11 issues a discharge instruction a1 for activating the discharge mechanism 140 at substantially the same time as issuing a power stop instruction to the NAND 13. The discharge mechanism 140 illustrated in FIG. 2 is a circuit provided to actively discharge the residual voltage on the power supply line 21 between the PMIC 14 and the NAND 13. More specifically, the discharge mechanism 140 is configured to release the residual voltage on the power supply line 21 to GND by a switch (N-type FET) 141 and a resistor 142 when the discharge instruction a1 is issued.

The speed (required time) at which the residual voltage on the power supply line 21 is discharged is determined by a resistance value of the resistor 142. In order to increase the speed, it is preferable to use a resistor 142 having a lower resistance value. However, it is difficult to provide a resistor 142 having a large volume and a low resistance value due to restriction on installation space in the PMIC 14. This is one factor that increases the time required to discharge the residual voltage on the power supply line 21.

In order to supply stable power from the PMIC 14 to the NAND 13, as illustrated in FIG. 2, a capacitor 22 for preventing power fluctuation on the power supply line 21 between the PMIC 14 and the NAND 13 is connected to the power supply line 21. At the point in time when the PMIC 14 cuts off supply of power to the NAND 13, the capacitor 22 is in a charged state. Electric power stored in the capacitor 22 is also required to be discharged by the discharge mechanism 140. That is, the capacitor 22 used for preventing power fluctuation also serves as a factor that increases the time to discharge the residual voltage on the power supply line 21.

In FIG. 2, the circuit configuration for supplying power from the PMIC 14 to the NAND 13 is illustrated as an example, but the disclosure is not limited thereto, and, a circuit configuration for supplying power from the PMIC 14 to the DRAM 12 or similar elements would likewise be similar.

Figure 3:
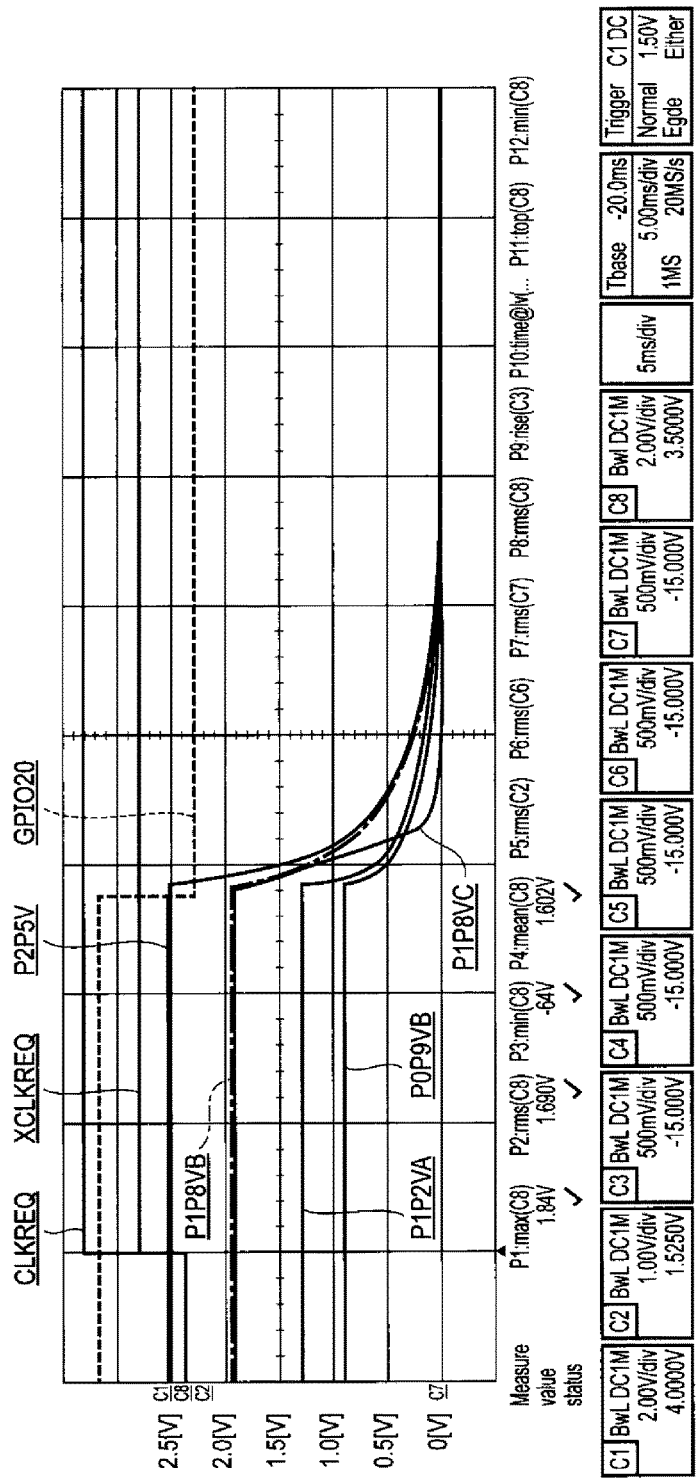
FIG. 3 is a second diagram for explaining further aspects of a general discharge method.

FIG. 3 illustrates an example of a timing transition of a supply voltage of the PMIC 14 in a case where the state of the SSD 1 is shifted from power state PS0 to PS5.

In FIG. 3, the line labeled "P1P8VB" corresponds to power supplied to the DRAM 12 and the line labeled "P2P5V" corresponds to power supplied to the NAND 13. The line labeled "GPIO 20" indicates a point in time at which a falling signal portion, which is the power stop instruction, is issued. Here, in a case of power state PS5, it is assumed that the SSD 1 cuts off power on five channels, including "P1P8VB" and "P2P5V," among power of eight channels to which power is supplied by the PMIC 14 so as to achieve lower power consumption.

As illustrated in FIG. 3, waveform shapes of supply voltages from the PMIC 14 represent a situation in which supply voltages after issuance of the power stop instruction do not fall in a step-wave shape, but rather gradually fall. Here, it is assumed that the voltage has to be dropped to at least 0.3 V to permit restart supply of "P1P8VB" and the voltage has to be dropped to at least 0.5 V to permit restart supply of "P2P5V" is described. In such a case, it takes about 5 milliseconds (ms) until these conditions are satisfied and for this time, the SSD 1 cannot return to PS0.

Based on matters described above, the discharge method of the first embodiment, in which a discharge time of the residual voltage can be reduced when the power stop instruction is issued, will be described in detail.

Figure 4:
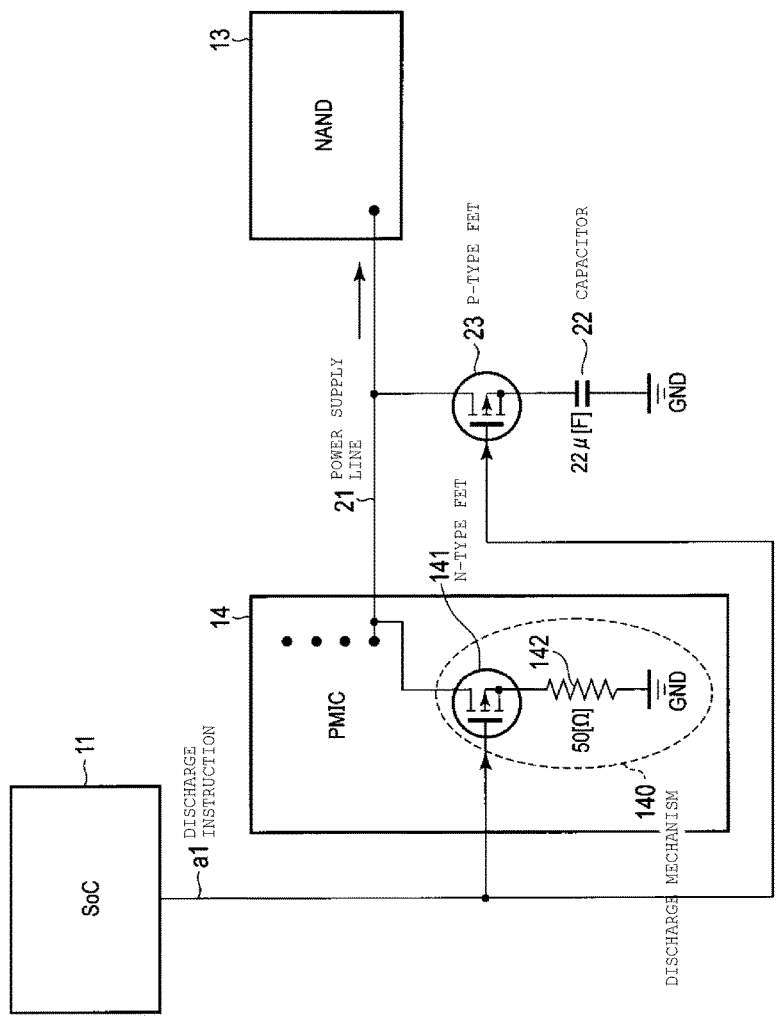
FIG. 4 is a diagram illustrating another example of a circuit configuration for supplying power in an electronic device of the first embodiment.

FIG. 4 is a diagram illustrating another example of a circuit configuration for supplying power from the PMIC 14 to the NAND 13 structured in the SSD 1 of the first embodiment.

As illustrated in FIG. 4, in the SSD 1 of the first embodiment, a switch 23 for disconnecting the capacitor 22 is provided. That is, the switch 23 is interposed between the power supply line 21 and the capacitor 22. The switch 23 may be a P-type FET in some embodiments. The circuit is configured such that a discharge instruction a1 issued from the SoC 11 is input to the switch 23 as a signal for disconnecting the capacitor 22 from the power supply line 21. A signal which is supplied to the switch 23 and disconnects the capacitor 22 from the power supply line 21 may be provided separately from the discharge instruction a1. That is, a wiring between the SoC 11 and the switch 23 and a wiring between the SoC 11 and the discharge mechanism 140 may be independent wirings rather than a common wiring.

By disconnecting the capacitor 22 from the power supply line 21, it is possible to reduce a total amount of electricity that must be discharged by the discharge mechanism 140 and thus significantly reduce the discharge time of the residual voltage on the power supply line 21. In certain examples, it may be possible to utilize electric power stored in the capacitor 22 for some purpose or otherwise this stored power may be released to GND.

Second Embodiment

In a case of the circuit configuration of the first embodiment described above (see FIG. 4), the capacitor 22 is disconnected from the power supply line 21, and thus the capacitor 22 is not required to be discharged in discharging of the residual voltage by the discharge mechanism 140. Thus, when the SSD 1 returns to power state PS0, more specifically, when the capacitor 22 is reconnected to the power supply line 21 in order to restart supply of power to the NAND 13, a large current flows into the power supply line 21 (which is at 0 V) at once. This may adversely affect, for example, the NAND 13 and peripheral circuits.

Figure 5:
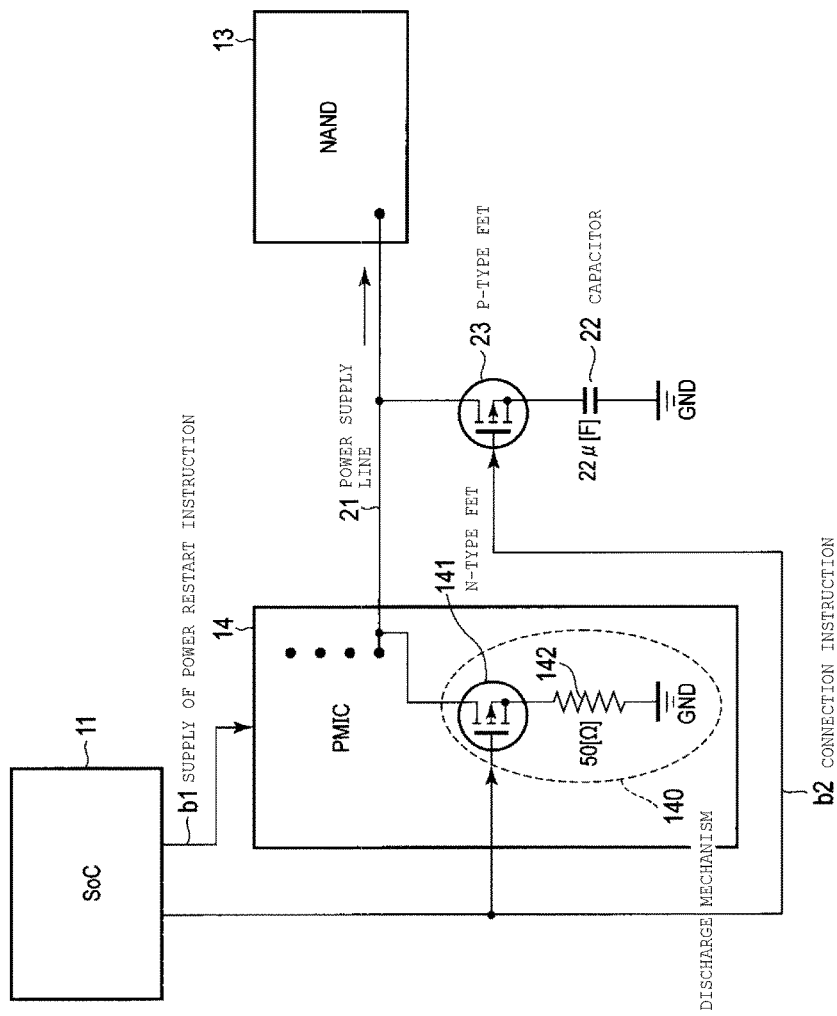
FIG. 5 is a diagram for explaining aspects of an operational procedure when returning to a normal state from a power saving state of an electronic device of a second embodiment.

Accordingly, in the second embodiment, in a case of returning the SSD 1 to power state PS0 from power state PS5, a timing for issuance of a power restart instruction b1 to the PMIC 14 and a timing for issuance of a connection instruction b2, which is a signal for connecting capacitor 22 to power supply line 21, to the switch 23 illustrated in FIG. 5 are set and controlled in the SoC 11. The connection instruction b2 is input to the discharge mechanism 140 as a signal for stopping the operation of the discharge mechanism 140. As described above, the wiring interconnections between the SoC 11 and the switch 23 and between the SoC 11 and the discharge mechanism 140 may be independent wirings or common wiring.

More specifically, in order to restart supply of power to the NAND 13 by the PMIC 14 at a predetermined time prior to the capacitor 22 being reconnected to the power supply line 21, the SoC 11 issues the connection instruction b2 after a predetermined period of time has elapsed after the power restart instruction b1 is issued. The SoC 11 issues an operation restart instruction to the NAND 13 after issuing the power restart instruction b1 and the connection instruction b2.

With this, first, a voltage of the power supply line 21 rises due to restart of supply of power to the NAND 13 by the PMIC 14, and then the capacitor 22 charged to substantially the same voltage is reconnected to the power supply line 21, so that it is possible to prevent a large current from surging into the power supply line 21 at once.

Figure 6:
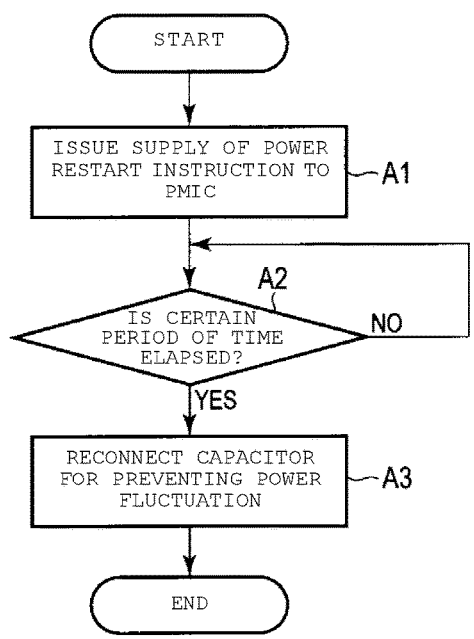
FIG. 6 is a flowchart illustrating aspects of an operational procedure when returning to a normal state from a power saving state of the electronic device of the second embodiment.

FIG. 6 is a flowchart illustrating an operation procedure of the SoC 11 in a case where the SSD 1 according to the second embodiment returns to power state PS0.

In a case where the SSD 1 is caused to return to power state PS0 from power state PS5, the SoC 11 first issues the power restart instruction b1 to the PMIC 14 (Step A1). When the power restart instruction b1 is issued, the SoC 11 waits until a predetermined period of time has elapsed (Step A2). When the predetermined period of time has elapsed (YES in Step A2), the SoC 11 issues the connection instruction to the switch 23 and reconnects the capacitor 22 to the power supply line 21 (Step A3).

As described above, in the SSD 1 of the second embodiment, it is possible to eliminate the large current flow into the power supply line 21 that might occur in the first embodiment.

Third Embodiment

Figure 7:
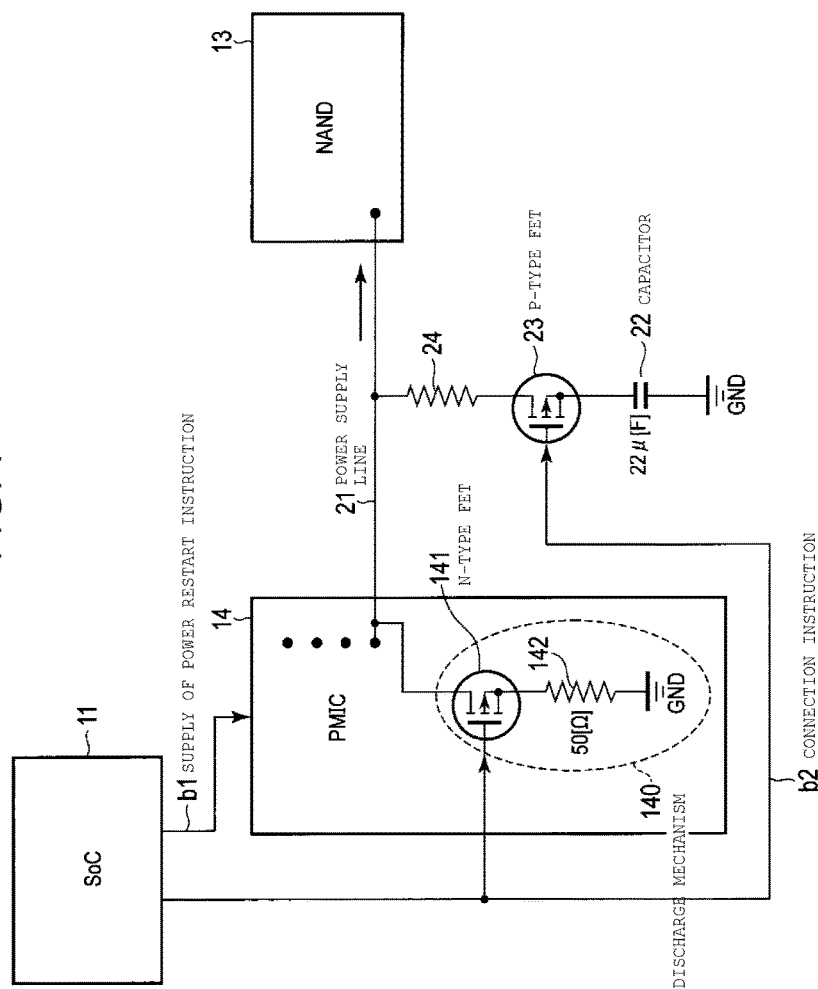
FIG. 7 is a diagram illustrating an example of a circuit configuration for supplying power in an electronic device of a third embodiment.

FIG. 7 is a diagram illustrating an example of a circuit configuration for supplying power from the PMIC 14 to the NAND 13 in the SSD 1 of the third embodiment.

Similar to the second embodiment, the SSD 1 of the third embodiment also has a mechanism for preventing a large current from surging into the power supply line 21 at the time of reconnection of the capacitor 22 to the power supply line 21.

As illustrated in FIG. 7, the SSD 1 of the third embodiment further includes a resistor 24 for preventing a large current from surging at the time of reconnection of the capacitor 22 to the power supply line 21. That is, the resistor 24 is interposed between the power supply line 21 and the capacitor 22.

By including the resistor 24, it is possible to prevent the large current from surging into the power supply line 21 at the time of reconnection of the capacitor 22 to the power supply line 21. A resistance value of the resistor 24 is preferably as small as possible (for example, 47 ohm) in order to still maintain an effect of preventing power fluctuation on the power supply line 21 with the capacitor 22.

In addition to including the resistor 24, the SoC 11 may also perform control to restart supply of power to the NAND 13 by the PMIC 14 at a predetermined time before the capacitor 22 is reconnected to the power supply line 21, as described in the second embodiment.

Fourth Embodiment

Figure 8:
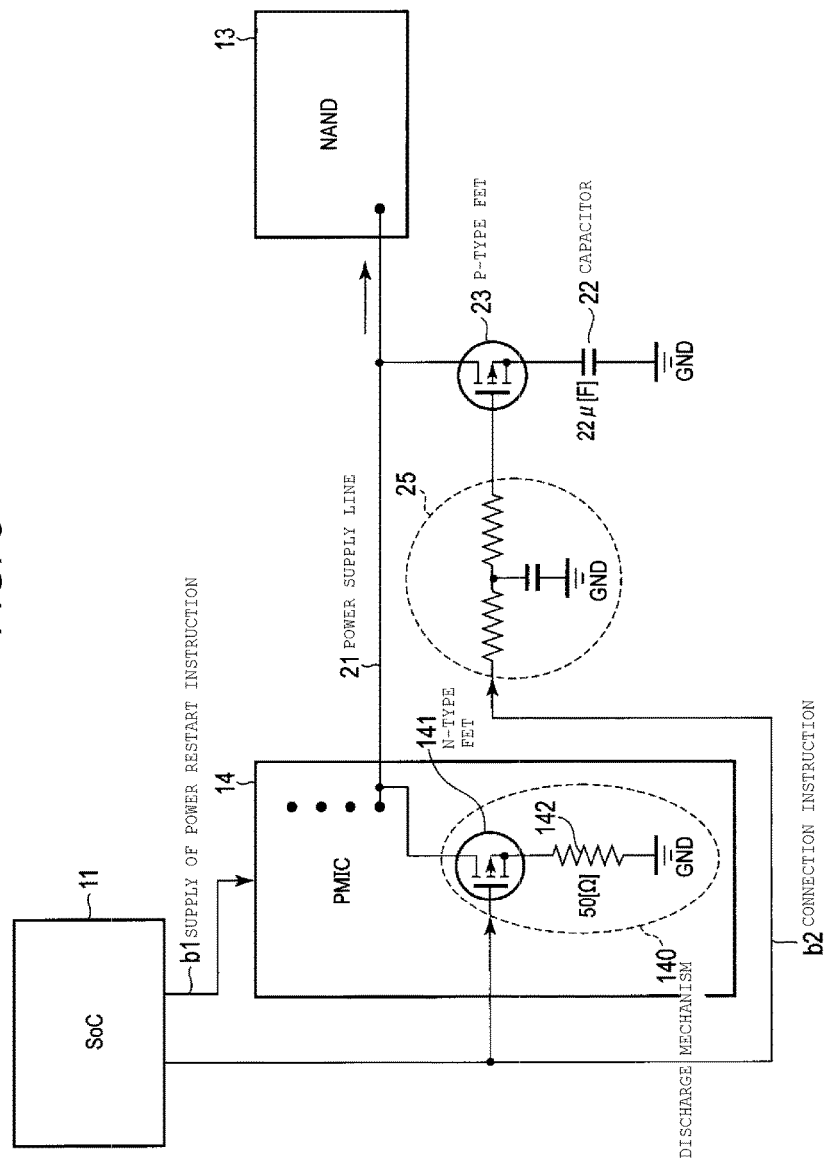
FIG. 8 is a diagram illustrating an example of a circuit configuration for supplying power in an electronic device of a fourth embodiment.

FIG. 8 is a diagram illustrating an example of a circuit configuration for supplying power from the PMIC 14 to the NAND 13 in the SSD 1 of the fourth embodiment.

Similar to the second embodiment and the third embodiment, the SSD 1 of the fourth embodiment also has a mechanism for preventing a large current from surging into the power supply line 21 at the time of reconnection of the capacitor 22 to the power supply line 21.

As illustrated in FIG. 8, the SSD 1 of the fourth embodiment further includes a filter circuit 25 for converting a waveform of the signal (the connection instruction b2) from a step-wave shape to a gentler, less abrupt waveform.

By including the filter circuit 25, the current more slowly flows into the power supply line 21 at the time of reconnection of the capacitor 22 to the power supply line 21. That is, it is possible to prevent a large current from surging into the power supply line 21.

In addition to including the filter circuit 25, the SoC 11 may perform control to restart supply of power to the NAND 13 by the PMIC 14 at a predetermined time before the capacitor 22 is reconnected to the power supply line 21, as described in the second embodiment.

Fifth Embodiment

Figure 9:
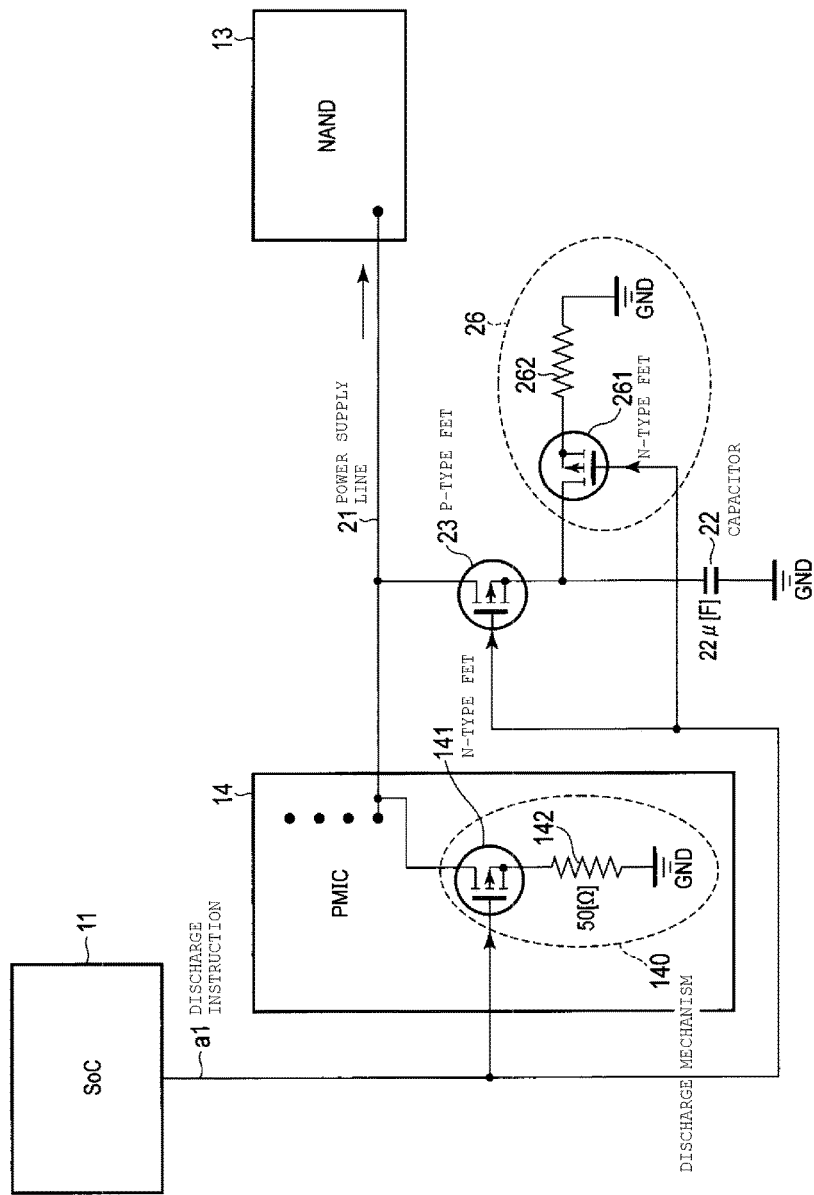
FIG. 9 is a diagram illustrating an example of a circuit configuration for supplying power in an electronic device of a fifth embodiment.

FIG. 9 is a diagram illustrating an example of a circuit configuration for supplying power from the PMIC 14 to the NAND 13 in the SSD 1 of the fifth embodiment.

Similar to the second through fourth embodiments, the SSD 1 of the fifth embodiment also has a mechanism for preventing a large current from surging into the power supply line 21 at the time of reconnection of the capacitor 22 to the power supply line 21.

As illustrated in FIG. 9, the SSD 1 of the fifth embodiment further includes a discharge mechanism 26 for the capacitor 22. When a discharge instruction a1 is issued, the discharge mechanism 26 is configured to release the residual voltage of the capacitor 22, while it is still disconnected from the power supply line 21, to the GND. For example, a switch 261 and a resistor 262 are provided in the discharge mechanism 26. The switch 261 may be, for example, an N-type FET. That is, in the SSD 1, a circuit is configured such that the discharge instruction a1 issued from the SoC 11 is also supplied to the switch 261 in addition to the switch 141. A wiring between the SoC 11 and the discharge mechanism 26 and a wiring between the SoC 11 and the discharge mechanism 140 may be independent wirings or common wiring.

With this configuration, it is possible to prevent a large current from surging into the power supply line 21 at the time of reconnection of the capacitor 22 to the power supply line 21. Although electric power stored in the capacitor 22 is not particularly utilized, it is released to GND at the time of cutting off supply of power to the NAND 13.

Sixth Embodiment

Figure 10:
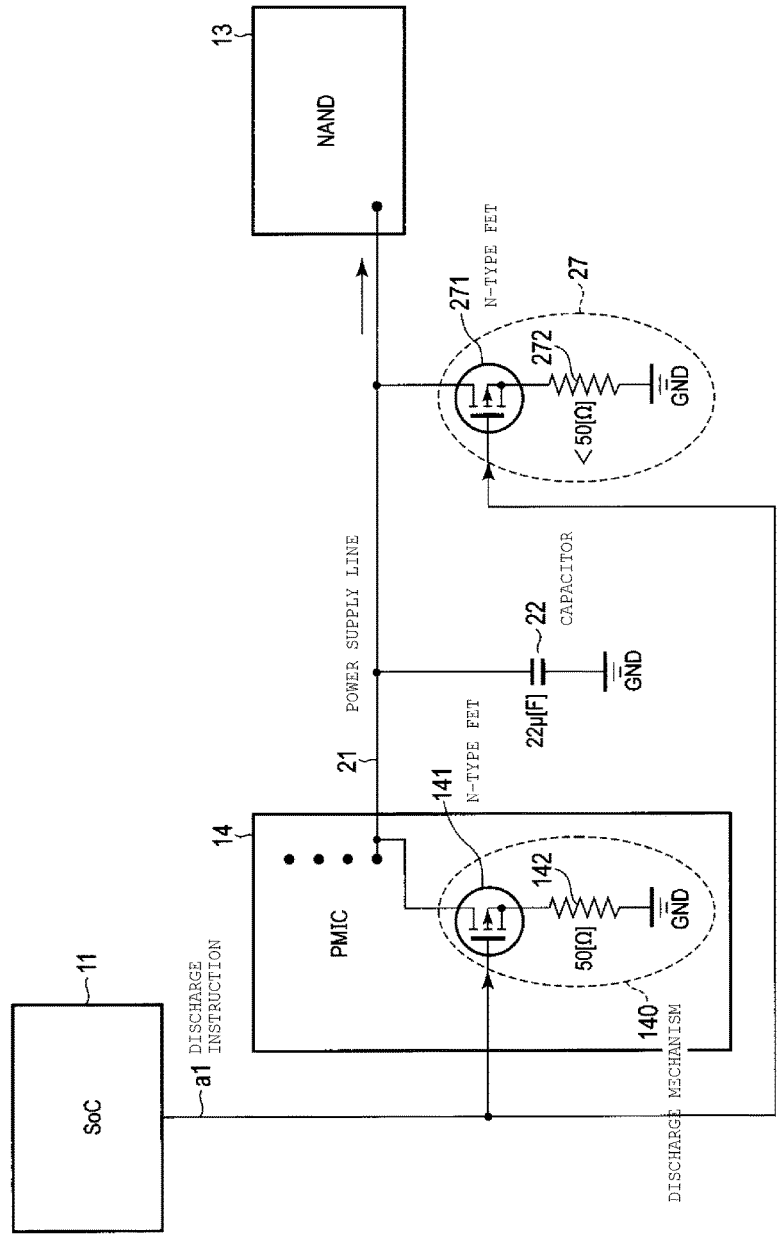
FIG. 10 is a diagram illustrating an example of a circuit configuration for supplying power in an electronic device of a sixth embodiment.

FIG. 10 is a diagram illustrating an example of a circuit configuration for supplying power from the PMIC 14 to the NAND 13 in the SSD 1 of the sixth embodiment.

As illustrated in FIG. 10, in the SSD 1 of the sixth embodiment, a discharge mechanism 27 for actively discharging the residual voltage on the power supply line 21 is provided outside the package of the PMIC 14 and outside the package of the NAND 13, in addition to the discharge mechanism 140 within the PMIC 14. The discharge mechanism 27 is configured to release the residual voltage on the power supply line 21 to GND, for example, by a switch (N-type FET) 271 and a resistor 272, when a discharge instruction a1 is issued. That is, in the SSD 1, a circuit is configured such that the discharge instruction a1 issued from the SoC 11 is supplied to the switch 271 in addition to the switch 141. A wiring between the SoC 11 and the discharge mechanism 27 and a wiring between the SoC 11 and the discharge mechanism 140 may be independent wirings or common wiring.

As described above, in the discharge mechanism 140 of the PMIC 14, it is difficult to provide a resistor 142 having a large volume and a low resistance value due to restriction on installation space within the PMIC 14. Accordingly, the discharge mechanism 27 provided on a substrate outside the PMIC 14 package serves to alleviate restrictions on installation space, and the resistance value of the resistor 272 can be made low with the same structure as that of the discharge mechanism 140.

In addition to the discharge mechanism 140 of the PMIC 14, the residual voltage on the power supply line 21 is discharged by the discharge mechanism 27 so as to make it possible to significantly reduce the discharge time of the residual voltage on the power supply line 21. It is not necessarily essential to lower the resistance value of the resistor 272 regarding the additional discharge mechanism 27 provided additionally.

Seventh Embodiment

Figure 11:
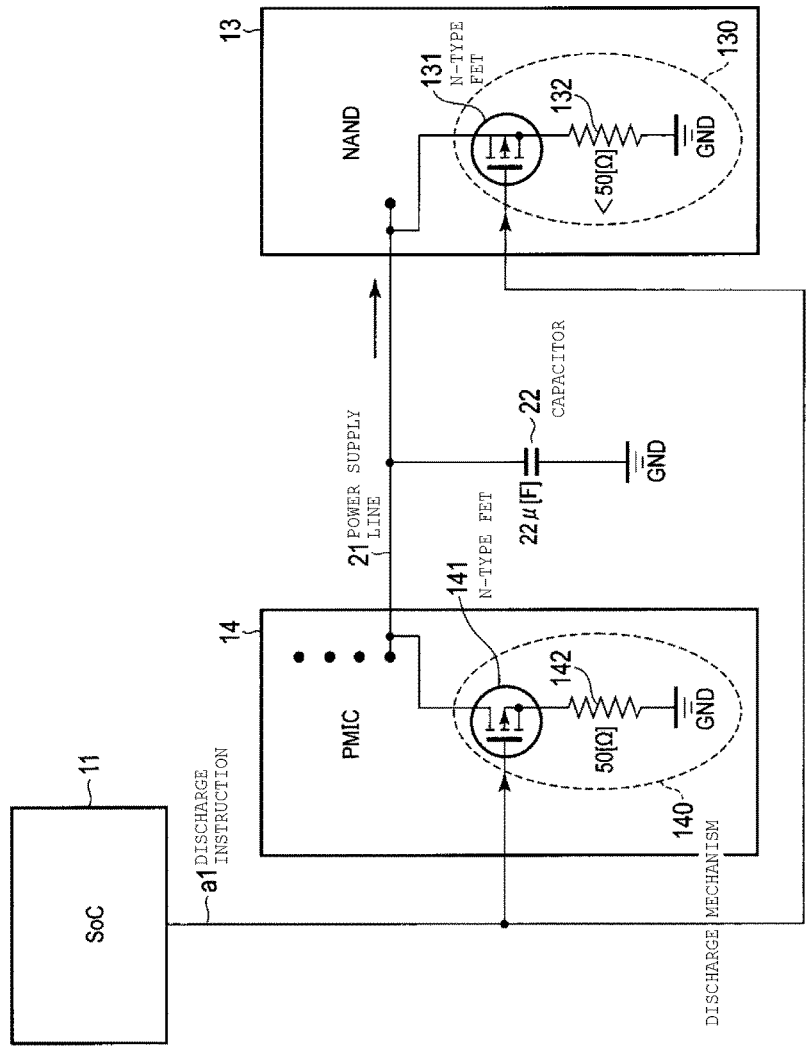
FIG. 11 is a diagram illustrating an example of a circuit configuration for supplying power in an electronic device of a seventh embodiment.

FIG. 11 is a diagram illustrating an example of a circuit configuration for supplying power from the PMIC 14 to the NAND 13 in the SSD 1 of the seventh embodiment.

As illustrated in FIG. 11, in the SSD 1 of the seventh embodiment, in addition to the discharge mechanism 140 within the PMIC 14, a discharge mechanism 130 for actively discharging the residual voltage on the power supply line 21 between the PMIC 14 and the NAND 13 is provided within the package of the NAND 13. The discharge mechanism 130 is configured to release the residual voltage on the power supply line 21 to GND, for example, by a switch (N-type FET) 131 and a resistor 132, when a discharge instruction a1 is issued. That is, in the SSD 1, a circuit is configured such that the discharge instruction a1 issued from the SoC 11 is also supplied to the switch 131 in addition to the switch 141. A wiring between the SoC 11 and the discharge mechanism 130 and a wiring between the SoC 11 and the discharge mechanism 140 may be independent wirings or common wiring.

As described above, in the discharge mechanism 140 of the PMIC 14, it is difficult to provide the resistor 142 having a large volume and a low resistance value due to restriction on installation space in the PMIC 14. In contrast, it is expected that restriction on installation space is somewhat alleviated in the NAND 13 package and/or the other component packages, such as the DRAM 12. Accordingly, regarding the discharge mechanism 130, the resistance value of the resistor 132 is made low with the same structure as that of the discharge mechanism 140.

In addition to the discharge mechanism 140 of the PMIC 14, the residual voltage on the power supply line 21 is discharged by the discharge mechanism 130 including the resistor 132 having a low resistance value so as to make it possible to significantly reduce the discharge time of the residual voltage on the power supply line 21. It is not necessarily essential to lower the resistance value of the resistor 132 regarding the discharge mechanism 130 additionally provided.

Eighth Embodiment

Figure 12:
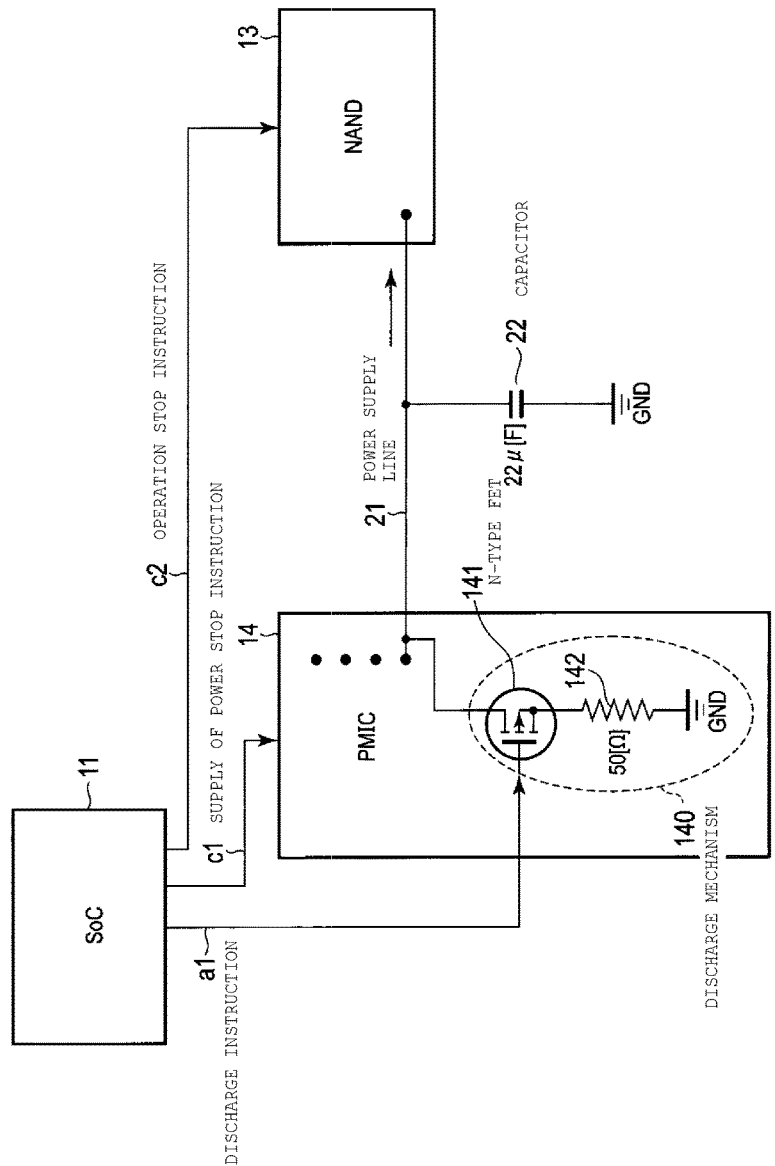
FIG. 12 is a diagram for explaining aspects of an operational procedure when shifting to a power saving state from a normal state of an electronic device of the eighth embodiment.

In the eighth embodiment, a procedure of control by the SoC 11 is changed so as to reduce the discharge time of the residual voltage on the power supply line 21 between the PMIC 14 and the NAND 13 at the time of cutting off supply of power to the NAND 13. With reference to FIG. 12, a control procedure for the SoC 11 of the eighth embodiment shifts the SSD 1, for example, from power state PS0 to power state PS5 will be described.

When cutting off the power supply (to the NAND 13 or the like) there may be scenarios such as the following: (1) a case of a so-called unauthorized power-off in which a power supply is unexpectedly cut off due to a power failure, (2) a case where the electronic device 1 is powered off by a power-off instruction is received from the host device 2, and (3) a case where the electronic device 1 is voluntarily powered off.

As described above, at the time of shift to power state PS5, the SoC 11 normally issues a stop instruction c2 to the NAND 13, and issues a power stop instruction c1 to the PMIC 14 after a grace period for permitting the completing of the execution of processing in preparation for stopping supply of power by the NAND 13. Here, electric power consumed by the NAND 13 in executing processing in preparation for stopping supply of power is substantially constant. Accordingly, the SoC 11 of the eighth embodiment issues the power stop instruction c1 to the PMIC 14 before issuing the stop instruction c2 to the NAND 13. In other words, the SoC 11 first issues the power stop instruction c1 to the PMIC 14, and then issues the stop instruction c2 to the NAND 13.

In this case, electric power for executing processing in preparation for stopping supply of power by the NAND 13 is provided by the electric power stored in the capacitor 22. The SoC 11 issues the discharge instruction a1 after the grace period for permitting the completing of the execution of the processing in preparation for stopping supply of power by the NAND 13, after issuing the power stop instruction c1 to the PMIC 14 and thereafter, for example, immediately thereafter, issues the stop instruction c2 to the NAND 13.

The residual voltage on the power supply line 21 to be discharged by the discharge mechanism 140 is in a lower state at the point in time when the discharge instruction a1 is issued and thus, it is possible to significantly reduce the discharge time of the residual voltage on the power supply line 21.

Figure 13:
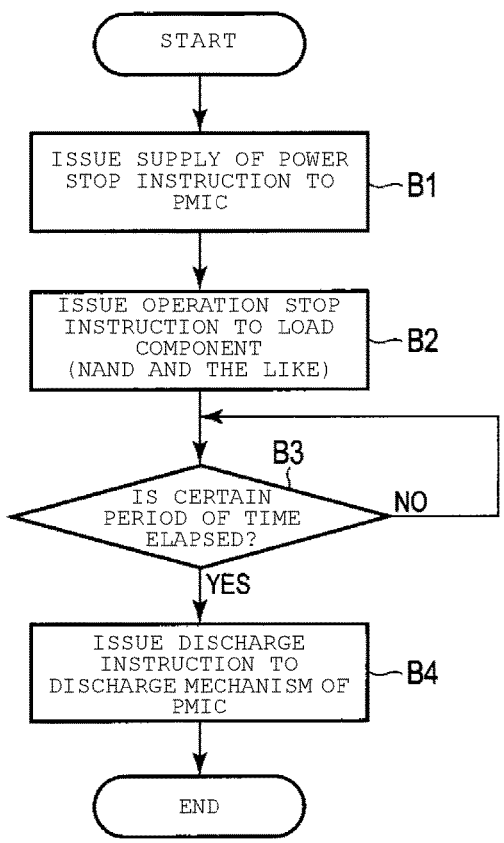
FIG. 13 is a flowchart illustrating aspects of an operational procedure when shifting to a power saving state from a normal state of the electronic device of the eighth embodiment.

FIG. 13 is a flowchart illustrating an operation procedure of the SoC 11 in a case where the SSD 1 of the eighth embodiment shifts from power state PS0 to power state PS5. In a case where the SSD 1 shifts from power state PS0 to power state PS5, the SoC 11 first issues the power stop instruction c1 to the PMIC 14 (Step B1). After issuing the power stop instruction c1, the SoC 11 issues the stop instruction c2 to the NAND 13 (Step B2). When the stop instruction c2 is issued, the SoC 11 waits until a predetermined period of time has elapsed (Step B3). When the predetermined period of time is elapsed (YES in Step B3), the SoC 11 issues a discharge instruction to the discharge mechanism 140 of the PMIC 14 (Step B4).

In the above description, the SSD 1 is assumed as the electronic device and discharge of the residual voltage on the power supply line 21 between the PMIC 14 and the NAND 13 in the SSD 1 is described, but the discharge method described in each of the embodiments is not limited thereto and can be applied to electric circuits with various IC components and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device, comprising:
    a first switch circuit between a power supply line and a ground potential, the first switch circuit being configured to electrically connect the power supply line to the ground potential upon receipt of a first control signal that is supplied when a supply of power on the power supply line is cut off;
    a capacitor connected between the power supply line and the ground potential;
    a second switch circuit between the capacitor and the power supply line, the second switch circuit being configured to disconnect the capacitor from the power supply line upon receipt of the first control signal; and
    a controller circuit configured to output the first control signal when the supply of power on the power supply line is cut off.

2. The electronic device according to claim 1, wherein the first switch circuit is connected in series with a resistor between the power supply line and the ground potential.

3. The electronic device according to claim 1,
    wherein the controller circuit is configured to output a second control signal after a lapse of a certain period after a restart of supplying of power on the power supply line, and
    the second switch circuit is configured to re-connect the capacitor to the power supply line upon receipt of the second control signal.

4. The electronic device according to claim 1, further comprising:
    a resistor between the capacitor and the power supply line.

5. The electronic device according to claim 1, wherein the second switch circuit comprises a field-effect transistor (FET).

6. The electronic device according to claim 1, further comprising:
    a filter circuit between the controller circuit and the second switch circuit, the filter circuit being configured to reduce a step-like quality of a waveform of control signals supplied from the controller circuit.

7. The electronic device according to claim 1, further comprising:
    a third switch circuit connected between the ground potential and a node between the second switch circuit and the capacitor; and
    a resistor between the third switch circuit and the ground potential, wherein
    the third switch circuit is configured to connect the node to the ground potential upon receipt of the first control signal.

8. The electronic device according to claim 1, wherein
    the first switch circuit comprises an N-type field effect transistor, and
    the second switch circuit comprises a P-type field effect transistor.

9. The electronic device according to claim 1, further comprising:
    a memory device configured to operate based on the supply of power on the power supply line and controlled by the controller circuit; and
    a power management integrated circuit including the first switch circuit, wherein
    the controller circuit is a system-on-chip incorporating a processing unit.

10. The electronic device according to claim 1, wherein the first and second switch circuits include each a field effect transistor.

11. An electronic device, comprising:
    a first switch circuit between a power supply line and a first ground terminal, the first switch circuit being electrically configured to connect the power supply line to the first ground terminal upon receipt of a control signal that is supplied when a supply of power on the power supply line is cut off;
    a capacitor between the power supply line and a second ground terminal;
    a second switch circuit between the power supply line and a third ground terminal, the second switch circuit being configured to electrically connect the power supply line to the third ground terminal upon receipt of the control signal; and a controller circuit configured to supply the control signal when the supply of power on the power supply line is cut off, wherein the first switch circuit is connected proximate to a first end of the power supply line, and the second switch circuit is connected proximate to a second end of the power supply opposite the first end.

12. The electronic device according to claim 11, further comprising:

a first resistor connected in series with the first switch circuit between the power supply line and the first ground terminal; and a second resistor connected in series with the second switch circuit between the power supply line and the third ground terminal.

13. The electronic device according to claim 12, wherein the first resistor has a resistance that is greater than a resistance of the second resistor.

14. The electronic device according to claim 11, wherein the second end of the power supply line is connected to a packaged electronic component, and the second switch circuit and the third ground terminal are provided outside the packaged electronic component.

15. The electronic device according to claim 11, wherein the second end of the power supply line is connected to a packaged electronic component, and the second switch circuit is provided inside the packaged electronic component.

16. The electronic device according to claim 11, wherein the first switch circuit and the second switch circuit comprise each N-type field effect transistors.

17. The electronic device according to claim 11, further comprising:

a power management integrated circuit including the first switch circuit, wherein the controller circuit is a system on a chip incorporating a processing unit, and the second end of the power supply line is connected to a memory device.

18. A method of controlling an electronic device including a power supply circuit with a first switch circuit between a power supply line and a ground potential, the first switch circuit being configured to connect the power supply line to the ground potential upon receipt of a control signal and a capacitor connected between the power supply line and the ground potential, the method comprising:

issuing a first instruction to the power supply circuit for stopping of supply of power to an electronic component connected to the power supply line;

issuing a second instruction for stopping operation which is executed therein, to the electronic component after issuing the first instruction; and supplying the control signal to the first switch circuit after an elapse of a certain time after the issuance of the second instruction.

19. The method of claim 18, wherein the electronic component comprises a NAND memory device.

20. The method of claim 18, wherein the first switch circuit comprises an N-type field effect transistor.

* * * * *